US011522038B2

(12) United States Patent
Yokoyama et al.

(10) Patent No.: US 11,522,038 B2
(45) Date of Patent: Dec. 6, 2022

(54) DISPLAY DEVICE FOR IMPROVING BRIGHTNESS UNEVENNESS IN DISPLAY REGION OF PECULIAR SHAPE

(71) Applicant: SHARP KABUSHIKI KAISHA, Sakai (JP)

(72) Inventors: Makoto Yokoyama, Sakai (JP); Junichi Yamada, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 183 days.

(21) Appl. No.: 17/041,918

(22) PCT Filed: Mar. 30, 2018

(86) PCT No.: PCT/JP2018/013995
§ 371 (c)(1),
(2) Date: Sep. 25, 2020

(87) PCT Pub. No.: WO2019/187161
PCT Pub. Date: Oct. 3, 2019

(65) Prior Publication Data
US 2021/0134930 A1    May 6, 2021

(51) Int. Cl.
H01L 27/32      (2006.01)
H01L 51/00      (2006.01)
H01L 51/56      (2006.01)

(52) U.S. Cl.
CPC ...... H01L 27/3276 (2013.01); H01L 51/0097 (2013.01); H01L 51/56 (2013.01); H01L 2227/323 (2013.01); H01L 2251/5338 (2013.01)

(58) Field of Classification Search
None
See application file for complete search history.

(56) References Cited

U.S. PATENT DOCUMENTS

| 8,139,194 B2* | 3/2012 | Yamamoto | G09G 3/3611 345/55 |
| 2006/0139551 A1 | 6/2006 | Kimura | |
| 2009/0102758 A1 | 4/2009 | Anzai et al. | |
| 2010/0156945 A1* | 6/2010 | Yoshida | G09G 3/3648 345/84 |
| 2011/0234957 A1 | 9/2011 | Watanabe et al. | |
| 2012/0112988 A1 | 5/2012 | Nakanishi et al. | |
| 2016/0190166 A1 | 6/2016 | Kim et al. | |
| 2016/0240141 A1* | 8/2016 | Lee | G09G 3/3258 |

(Continued)

FOREIGN PATENT DOCUMENTS

| JP | 2006-209089 A | 8/2006 |
| JP | 2008-003118 A | 1/2008 |
| JP | 2009-134246 A | 6/2009 |

(Continued)

Primary Examiner — J. E. Schoenholtz
(74) Attorney, Agent, or Firm — ScienBiziP, P.C.

(57) ABSTRACT

A frame region includes a first routed wire extending from one of a plurality of scan signal lines, one of a plurality of light-emission control lines, or one of a plurality of data signal lines. The first routed wire is electrically connected to drive circuits. The first routed wire is included in a first metal layer. A first conductive film is included in a second metal layer. The first routed wire and the first conductive film overlap each other via an inorganic insulating film.

19 Claims, 14 Drawing Sheets

(56) References Cited

U.S. PATENT DOCUMENTS

2018/0006105 A1* 1/2018 Kim .................... H01L 27/3265
2022/0013621 A1* 1/2022 Kim .................... G09G 3/3266

FOREIGN PATENT DOCUMENTS

| JP | 2011-070104 A | 4/2011 |
| JP | 2012-103335 A | 5/2012 |
| JP | 2016-148843 A | 8/2016 |
| WO | 2008062575 A1 | 5/2008 |

* cited by examiner

DISPLAY DEVICE FOR IMPROVING BRIGHTNESS UNEVENNESS IN DISPLAY REGION OF PECULIAR SHAPE

TECHNICAL FIELD

The disclosure relates to a display device.

BACKGROUND ART

Patent Literature 1 discloses a technique of preventing brightness unevenness in a display region of peculiar shape (shape in which a corner is cut).

CITATION LIST

Patent Literature

Patent Literature 1: Japanese Patent Application Laid-Open No. 2012-103335 (published on May 31, 2012)

SUMMARY

Technical Problem

The display region in the conventional technique unfortunately has a limited shape.

Solution to Problem

A display device according to one aspect of the disclosure includes a display region that is non-rectangular, and a frame region disposed around the display region. The display region includes the following: a plurality of data signal lines that transmit a data signal; a plurality of scan signal lines intersecting with the plurality of data signal lines; a plurality of light-emission control lines; and a plurality of sub-pixel circuits provided so as to correspond to points of intersection between the plurality of data signal lines and the plurality of scan signal lines. The display device includes the following: a drive circuit electrically connected to the plurality of data signal lines; a drive circuit electrically connected to the plurality of scan signal lines; and a drive circuit electrically connected to the plurality of light-emission control lines. The frame region includes a first routed wire extending from one of the plurality of scan signal lines, one of the plurality of light-emission control lines, or one of the plurality of data signal lines. The first routed wire is electrically connected to the drive circuits. The first routed wire is included in a first metal layer. The display device includes a first conductive film included in a second metal layer. The first routed wire and the first conductive film overlap each other via an inorganic insulating film.

Advantageous Effect of Disclosure

The aspect of the disclosure improves brightness unevenness in a display region of peculiar shape.

DESCRIPTION OF EMBODIMENTS

The term "in the same layer" hereinafter refers to that one layer is formed in the same process step (film formation step) as the other thing. The term "in a lower position than" hereinafter refers to that one layer is formed in a process step anterior to a process step of forming the comparative layer. The term "in a higher position than" hereinafter refers to that one layer is formed in a process step posterior to a process step of forming the comparative layer.

Figure 1:
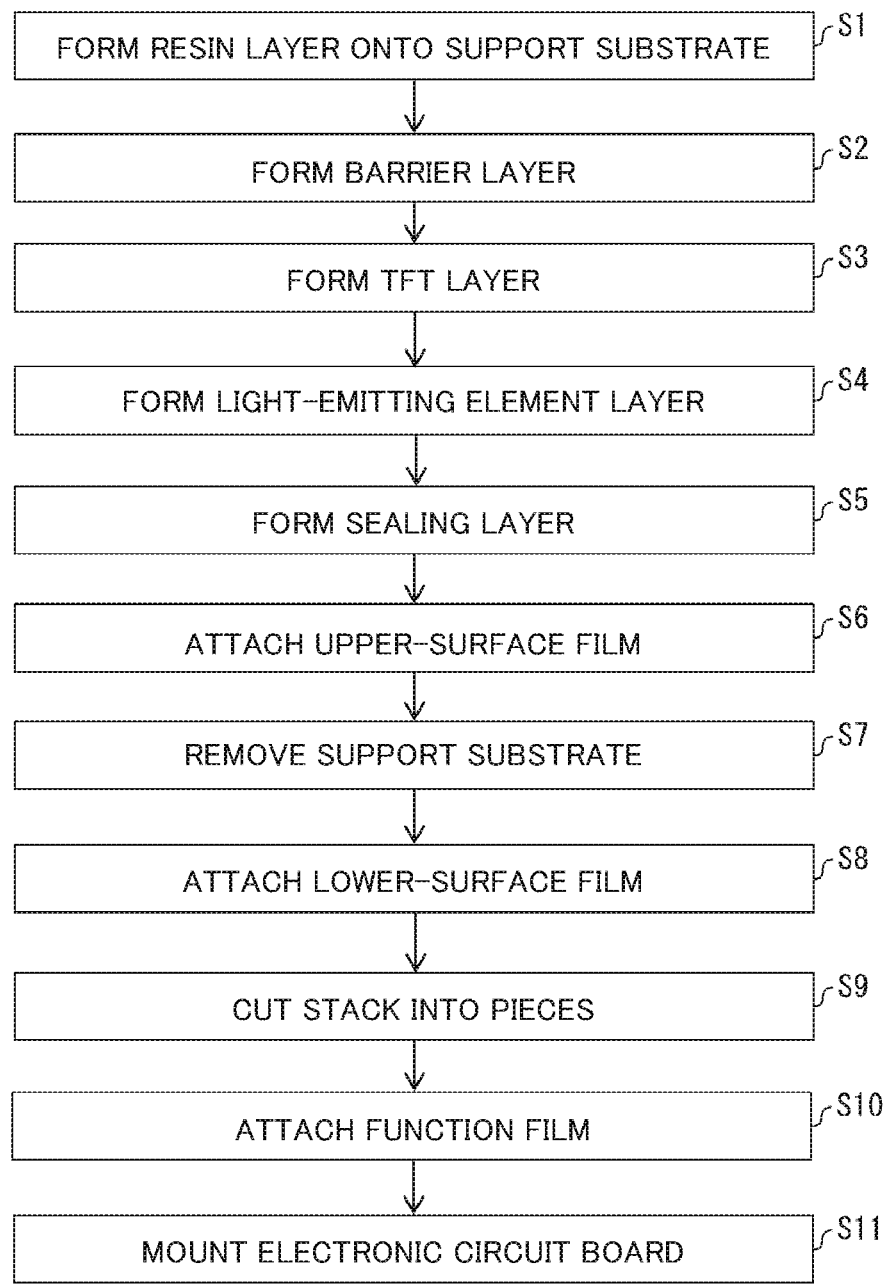
FIG. 1 is a flowchart illustrating how to manufacture a display device.

FIG. 1 is a flowchart illustrating, by way of example only, how to manufacture a display device. FIG. 2(a) is a cross-sectional view of an example configuration of a display portion of the display device. FIG. 2(b) is a flowchart illustrating, by way of example only, process steps for forming a TFT layer.

Figure 2:
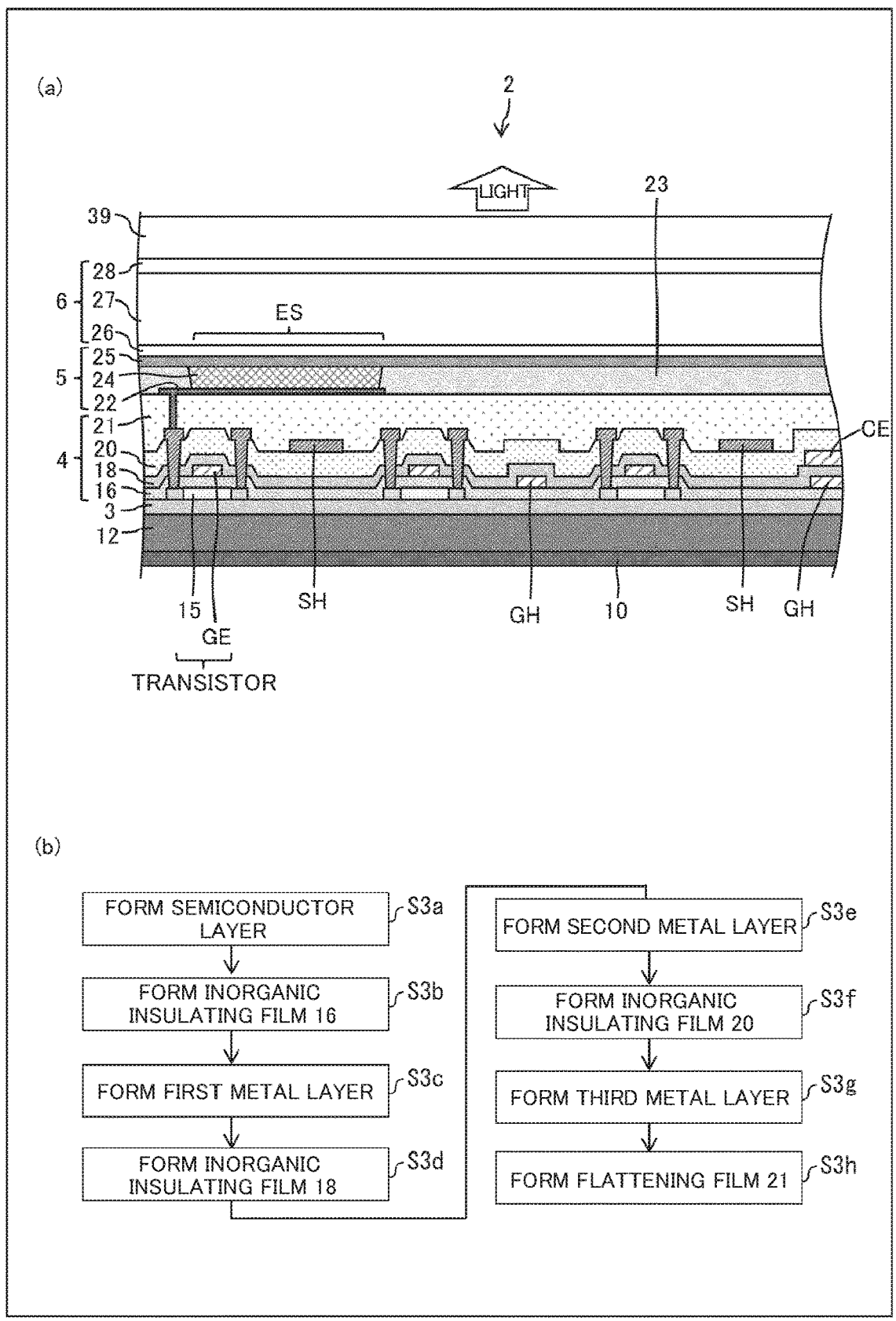
FIG. 2(a) illustrates an example configuration of a display portion of the display device in cross-section.
FIG. 2(b) is a flowchart illustrating process steps for forming a TFT layer.

Manufacturing a flexible display device includes the following process steps in sequence as illustrated in FIGS. 1 and 2: Step S1 of forming a resin layer 12 onto a translucent support substrate (e.g., a mother glass substrate); Step 2 of forming a barrier layer 3; Step S3 of forming a TFT layer 4; Step S4 of forming a top-emission light-emitting element layer 5; Step S5 of forming a sealing layer 6; and Step S6 of attaching an upper-surface film to the sealing layer 6.

This manufacture also includes the following process steps in sequence: Step S7 of removing the support substrate from the resin layer 12 by laser light irradiation or other methods; Step S8 of attaching a lower-surface film 10 to the lower surface of the resin layer 12; Step S9 of cutting a stack of the lower-surface film 10, resin layer 12, barrier layer 3, TFT layer 4, light-emitting-element layer 5, and sealing layer 6 into a plurality of pieces; Step S10 of attaching a function film 39 to the resultant pieces; and Step S11 of mounting an electronic circuit board (e.g., an IC chip and an FPC) onto a part (where terminals are placed) of a region (a frame region NA) that is outside a display region where a plurality of sub pixels are disposed. Steps S1 to S11 are performed by an apparatus that manufactures the display device (including a film formation apparatus that performs Steps S1 to S5).

The resin layer 12 is made of, but not limited to, polyimide. The resin layer 12 can be replaced with a set of two resin films (e.g., polyimide films) and one inorganic insulating film interposed between these resin films.

The barrier layer 3 prevents foreign substances, such as water and oxygen, from entering the TFT layer 4 and the light-emitting-element layer 5. The barrier layer 3 can be composed of a silicon oxide film, a silicon nitride film, or a silicon oxide nitride film, each of which is formed through CVD, or can be composed of a stack of these layers.

The TFT layer 4 includes the following components: a semiconductor film 15; an inorganic insulating film 16 (a gate insulating film) in a higher position than the semiconductor film 15; a gate electrode GE and a gate line GH in a higher position than the inorganic insulating film 16; an inorganic insulating film 18 in a higher position than the gate electrode GE and gate wire GH; a capacitor electrode CE in a higher position than the inorganic insulating film 18; an inorganic insulating film 20 in a higher position than the capacitor electrode CE; a source wire SH in a higher position than the inorganic insulating film 20; and a flattening film 21 (an interlayer insulating film) in a higher position than the source wire SH.

The semiconductor film 15 is made of, but not limited to, low-temperature polysilicon (LTPS) or oxide semiconductor (e.g., In—Ga—Zn—O semiconductor). Together with the gate electrode GE, the semiconductor film 15 forms a transistor (herein a TFT). Although the transistor has a top-gate structure in FIG. 2, it may have a bottom-gate structure.

The gate electrode GE, gate wire GH, capacitor electrode CE, and source wire SH are each composed of a monolayer film of metal including at least one of, for instance, aluminum, tungsten, molybdenum, tantalum, chromium, titanium, and copper; alternatively these components are each composed of a laminated films of these materials. The TFT layer 4 in FIG. 2(b) includes one semiconductor layer and three metal layers (i.e., first, second, and third metal layers).

The inorganic insulating films 16, 18, and 19 each can be composed of, for instance, a silicon oxide (SiOx) film or a silicon nitride (SiNx) film, both of which are formed through CVD, or each can be composed of a laminated layer of these films. The flattening film 21 can be made of organic material that can be applied, such as polyimide or acrylic.

The light-emitting-element layer 5 includes the following components: an anode 22 in a higher position than the flattening film 21; an edge cover 23 that is insulating and covering the edge of the anode 22; an electroluminescence (EL) layer 24 in a higher position than the edge cover 23; and a cathode 25 in a higher position than the EL layer 24. The edge cover 23 is made of organic material (such as polyimide or acrylic) patterned through photolithography after application.

For each sub-pixel, the light-emitting element ES (e.g., organic light-emitting diode or OLED for short and quantum-dot light-emitting diode or QLED for short) including the anode 22, EL layer 24, and cathode 25, each of which is in the form of an island, is disposed in the light-emitting element layer 5. The light-emitting element ES is controlled by a control circuit disposed in the TFT layer 4. The light-emitting element and the control circuit constitute a sub-pixel circuit.

The EL layer 24 is composed of, but not limited to, a set of the following layers sequentially stacked from below: a hole injection layer, a hole transport layer, a light-emitting layer, an electron transport layer, and an electron injection layer. The light-emitting layer is provided in the form of islands in the openings of the edge cover 23 (for each pixel) through a vapor deposition method or an ink-jet method. The other layers are provided either in the form of islands or in a flat manner (common layer). One or more of the hole injection layer, hole transport layer, electron transport layer, and electron injection layer can be omitted.

Forming a light-emitting layer of an OLED uses a fine metal mask (FMM). An FMM is a sheet (made of Invar for instance) having many openings, through one of which an organic substance passes, thus forming an island-shaped light-emitting layer (corresponding to a single sub-pixel).

Forming a light-emitting layer of a QLED uses ink-jet application of a solvent containing diffused quantum dots for instance, thus forming an island-shaped light-emitting layer (corresponding to a single sub-pixel).

For instance, the anode 22 is composed of a stacked layer of indium tin oxide (ITO) and silver (Ag) or is composed of a stacked layer of ITO and Ag-containing alloy. The anode 22 reflects light. The cathode 25 can be composed of a translucent conductor, such as a MgAg alloy (extremely thin film), an ITO, or an indium zinc oxide (IZO).

When the light-emitting element ES is an OLED, a drive current between the anode 22 and cathode 25 rejoins holes and electrons within the light-emitting layer, thus generating excitons. These excitons emit light in the process of transition to a ground state. Since the cathode 25 transmits light, and the anode 22 reflects light, the light from the EL layer 24 travels upward and goes out from the top.

When the light-emitting element ES is a QLED, a drive current between the anode 22 and cathode 25 rejoins holes and electrons within the light-emitting layer, thus generating excitons. These excitons emit light (fluorescent light) in the process of transition from a conduction band level of the quantum dots to a valence band level of the quantum dots.

The light-emitting-element layer 5 may include light-emitting elements (e.g., inorganic light-emitting diodes) other than such OLEDs and QLEDs as described above.

The sealing layer 6 transmits light. The sealing layer 6 includes an inorganic sealing layer 26 covering the cathode 25, an organic buffer film 27 in a higher position than the inorganic sealing layer 26, and an inorganic sealing film 28 in a higher position than the organic buffer film 27. The sealing layer 6, which covers the light-emitting-element layer 5, prevents foreign substances, such as water and oxygen, from penetrating the light-emitting-element layer 5.

Each of the inorganic sealing layers 26 and 28 is an inorganic insulating film. Each of the inorganic sealing layers 26 and 28 can be composed of, for instance, a silicon oxide film, a silicon nitride film, or a silicon oxide nitride film, each of which is formed through CVD, or can be composed of a stack of these films. The organic buffer film 27 is a translucent organic film that flattens a film, and can be made of organic material that can be applied, such as acrylic. The organic buffer film 27 can be formed through ink-jet application for instance; in some embodiments, a bank for stopping ink droplets may be provided in the non-display region.

The lower-surface film 10 is, but not limited to, a PET film attached to the lower surface of the resin layer 12 after the removal of the support substrate, thus achieving a highly flexible display device. The function film 39 serves for instance as at least one of an optical compensator, a touch sensor, and a protector.

The foregoing has described a flexible display device. Manufacturing a non-flexible display device, which typically does not require formation of a resin layer and replacement of a base material, involves Steps S2 to S5 of stacking layers onto a glass substrate, followed by Step S9 for instance.

First Embodiment

Figure 3:
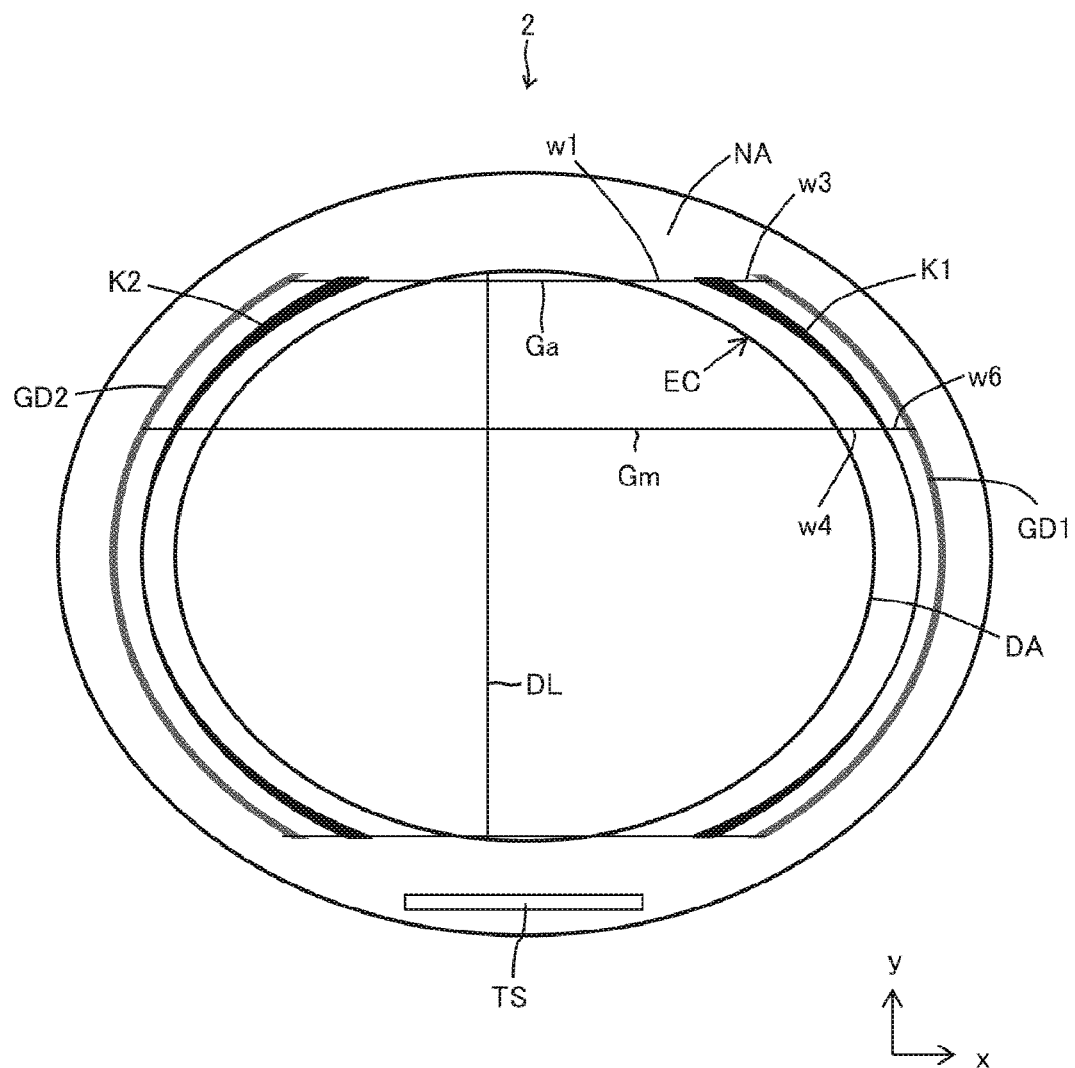
FIG. 3 is a plan view of the configuration of a display device according to a first embodiment.
Figure 4:
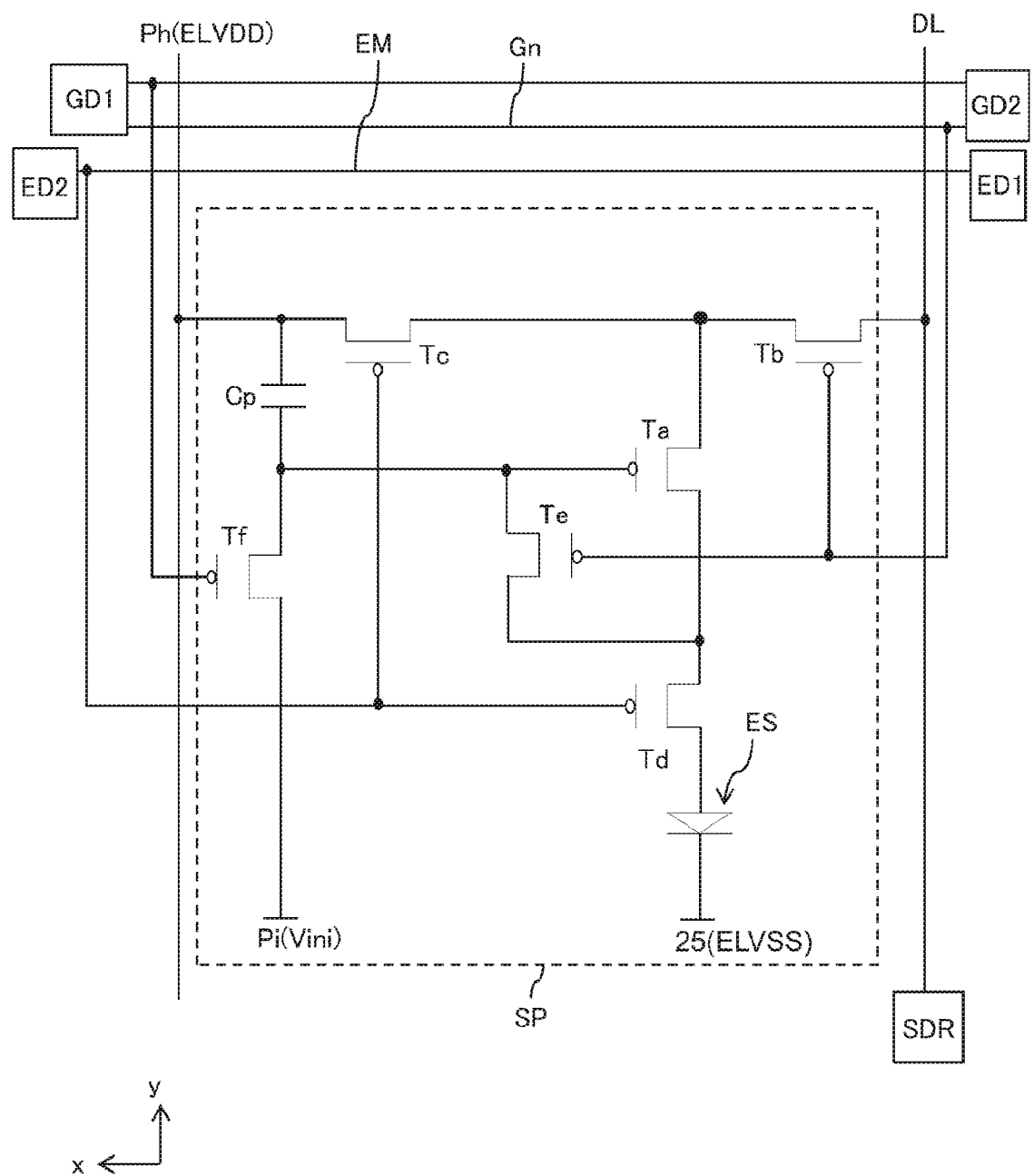
FIG. 4 is a circuit diagram illustrating an example configuration of a sub-pixel circuit in a display region.

FIG. 3 is a plan view of the configuration of a display device according to a first embodiment. FIG. 4 is a circuit diagram illustrating an example configuration of a sub-pixel circuit included in a display region. FIG. 3 shows a display device 2 that includes a display region DA including sub-pixels, and a frame region (non-display region) NA disposed around the display region DA. The display region DA has an elliptic shape whose major axis extends in the x-direction. The display region DA has an edge the entire of which is a curved edge EC. The display region DA includes sub-pixel circuits SP each including the light-emitting element ES. Each sub-pixel circuit SP is connected to a data signal line DL, a scan signal line GL, a light-emission control line EM, a high-voltage power-source line Ph, and an initialization power-source line Pi. The sub-pixel circuit SP includes a capacitor Cp having one end connected to the high-voltage power-source line Ph, and the other electrode connected to the gate terminal of a drive transistor Ta. The drive transistor Ta has the gate terminal connected to a scan signal line Gx, a source terminal connected to the data signal line DL via a write transistor Tb, and a drain terminal connected to the light-emitting element ES via a transistor Td. The data signal line DL is connected to a source driver SDR; the scan signal line GL, to gate drivers GD1 and GD2; and the light-emission control line EM, to emission drivers ED1 and ED2. The gate drivers GD1 and GD2 and the emission drivers ED1 and ED2 are monolithic in the TFT layer 4 included in the frame region NA. The gate drivers GD1 and GD2 has an arcuate shape along the curved edge EC and are arranged in the direction of the major axis so as to interpose the display region DA.

In the display device 2, the display region DA includes scan signal lines Ga and Gm extending in the x-direction, and the data signal line DL extending in the y-direction and intersecting with the scan signal lines Ga and Gm. The scan signal line Gm is closer to the middle of the display region than the scan signal line Ga is, and is longer than the scan signal line Ga.

The scan signal lines Ga and Gm are connected to the gate drivers GD1 and GD2. The frame region NA includes a terminal TS, which is used for mounting an external substrate, at one end in the direction of the minor axis (the y-direction). Hereinafter, first to eighth routed wires w1 to w8 will be respectively abbreviated to routed wires w1 to w8. In addition, a first conductive film K1 will be abbreviated to a conductive film K1; and a second conductive film K2, a conductive film K2.

Figure 5:
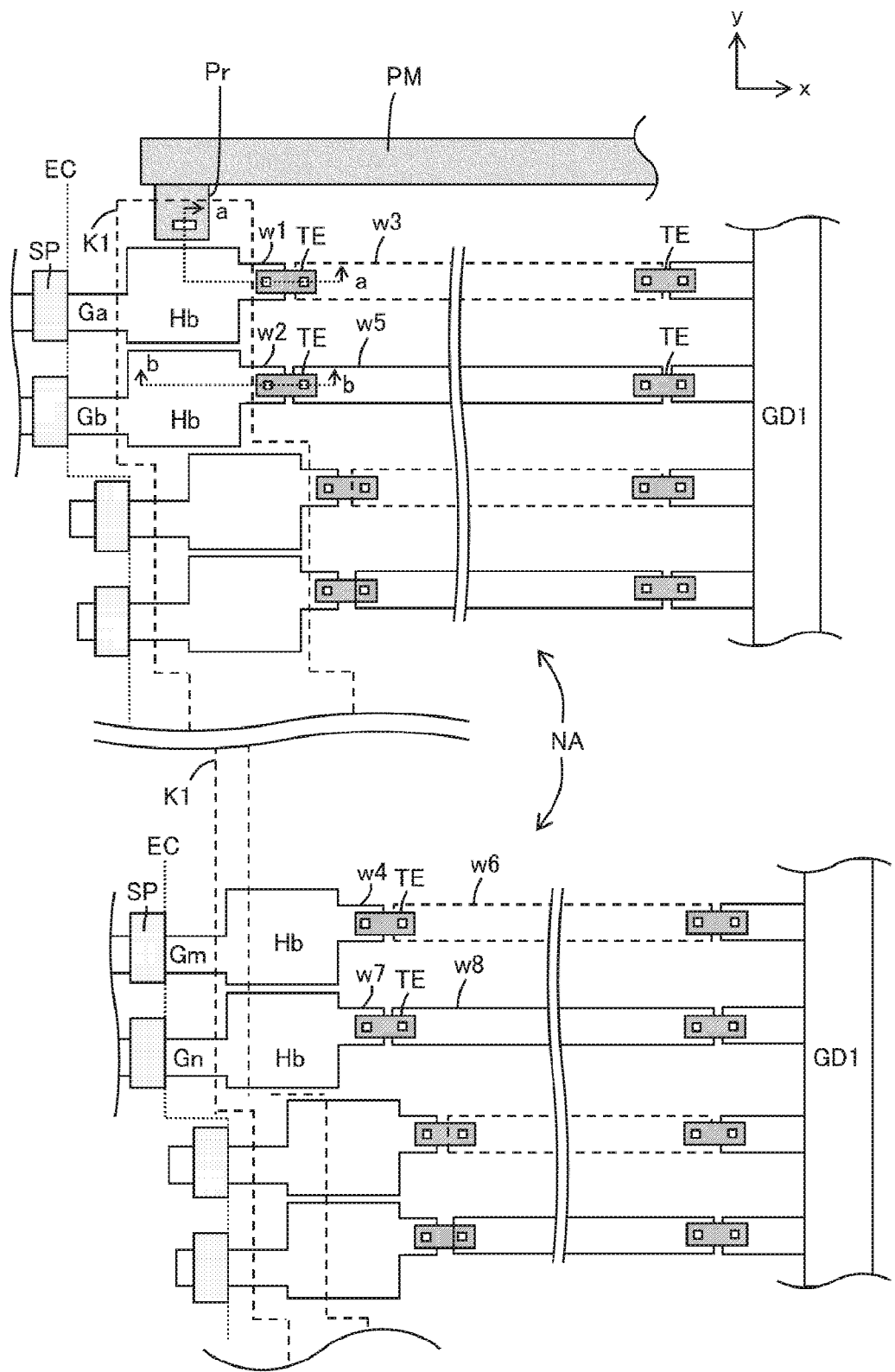
FIG. 5 is a plan view of a configuration around the edge of the display region.

FIG. 5 is a plan view of a configuration around the edge of the display region. FIG. 6(a) is a cross-sectional view taken along line a-a in FIG. 5. FIG. 6(b) is a cross-sectional view taken along line b-b in FIG. 5. FIG. 5 is also an enlarged view of the upper-right side of FIG. 3. The region on the left side of FIG. 5 including the illustrated pixel circuit SP is the display region, and the region on the right side of the illustrated sub-pixel circuit SP is the frame region. The curved edge EC is defined by the furthermost sub-pixels SP in the display region.

As illustrated in FIG. 2, the TFT layer 4 is formed through the following process steps: Step S3a of forming a semiconductor layer (including the semiconductor film 15 in FIG. 2), Step S3c of forming a first metal layer (including the gate electrode GE and gate wire GH in FIG. 2), Step S3e of forming a second metal layer (including the capacitor electrode CE in FIG. 2), and Step S3g of forming a third metal layer (including the source wire SH in FIG. 2).

Figure 6:
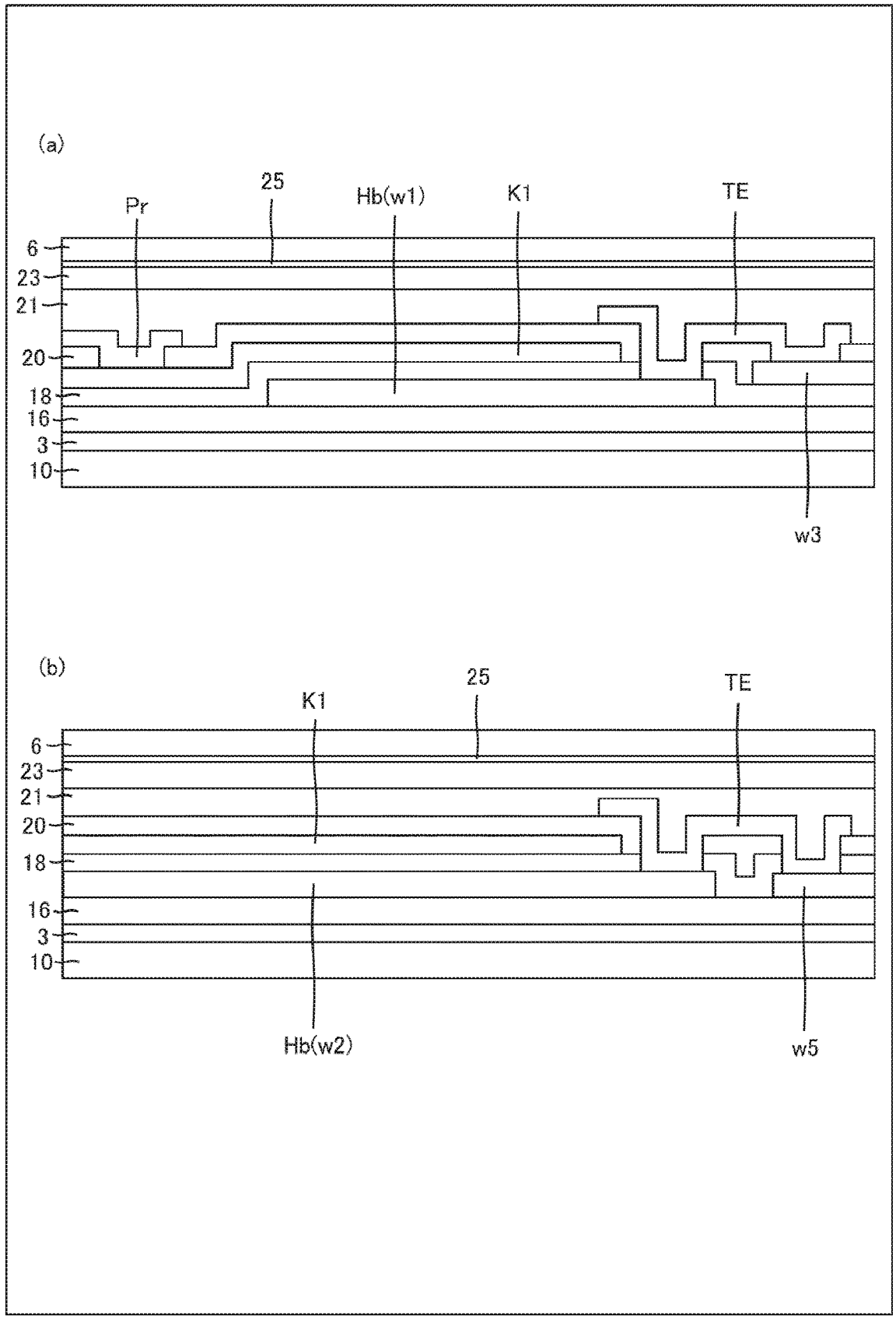
FIG. 6(a) is a cross-sectional view taken along line a-a in FIG. 5.
FIG. 6(b) is a cross-sectional view taken along line b-b in FIG. 5.

As illustrated in FIGS. 5 and 6, the TFT layer 4 of the display device 2 includes the following: a routed wire w1 (included in the first metal layer) routed from the curved edge EC to the frame region NA; a routed wire w2 (included in the first metal layer) adjacent to the routed wire w1; a routed wire w3 (included in the second metal layer) electrically connected to the routed wire w1 via a relay electrode TE and routed to the gate driver GD1; and a routed wire w5 (included in the second metal layer) electrically connected to the routed wire w2 via another relay electrode TE and routed to the gate driver GD1.

The routed wire w1 extends from the scan signal line Ga (included in the first metal layer); and the routed wire w2, from the scan signal line Gb (included in the first metal layer). That is, the scan signal line Ga is connected to the gate driver GD1 via the routed wires w1 and w3; and the scan signal line Gb, to the gate driver GD1 via the routed wires w2 and w5.

As illustrated in FIGS. 5 and 6, disposed in a gap between the curved edge EC and the gate driver GD1 is a conductive film K1 (included in the second metal layer) overlapping the routed wires w1 and w2 via the inorganic insulating film 18. To be specific, the routed wires w1 and w2 individually have their wide portions Hb widening the respective routed wires w1 and w2 locally. In addition, the conductive film K1 overlaps each wide portion Hb in whole. Each wide portion Hb has an elongated shape larger in the direction of extension (the x-direction) than in the direction of width (the y-direction orthogonal to the x-direction). This shape enables capacitances between the wide portions Hb and the conductive film K1 to be added to the routed wires w1 and w2.

The display device 2 includes the following: a routed wire w4 (included in the first metal layer) extending from the scan signal line Gm (passing closer to the middle of the display region than the scan signal line Ga); and a routed wire w6 (included in the second metal layer) electrically connected to the routed wire w4 via another relay electrode TE and routed to the gate driver GD1. The conductive film K1 has an arcuate shape whose width increases from its middle toward its both ends in plan view, as illustrated in FIG. 3. The overlap between the routed wire w4 (wide portion Hb) and the conductive film K1 is smaller in area than the overlap between the routed wire w1 (wide portion Hb) and the conductive film K1. The routed wire w4 thus receives a capacitance smaller than that added to the routed wire w1.

Figure 7:
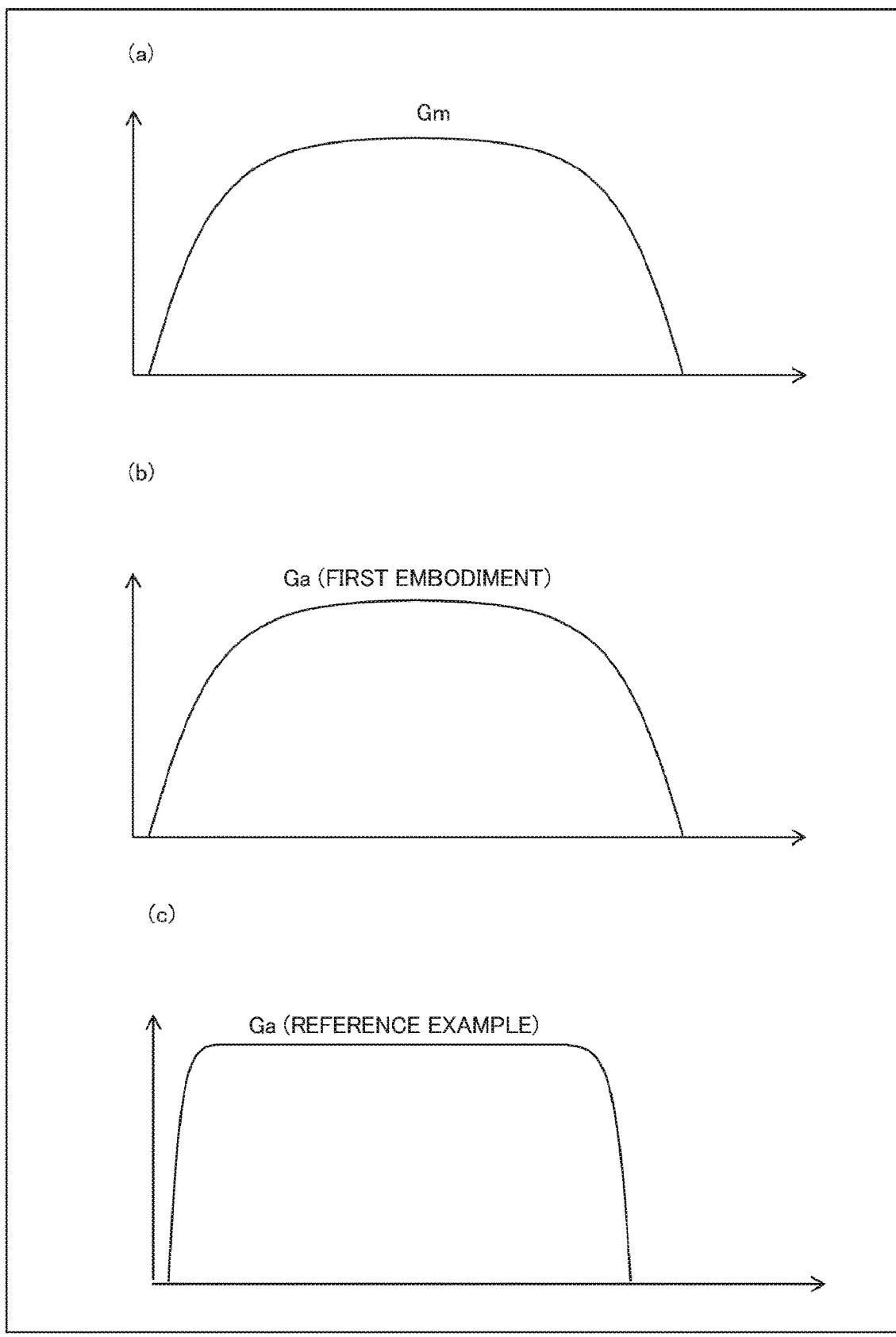
FIG. 7(a) and FIG. 7(b) are schematic diagrams of a scan pulse waveform in the first embodiment.
FIG. 7(c) is a schematic diagram of a scan pulse waveform in a reference example.

FIG. 7(a) and FIG. 7(b) are schematic diagrams of a scan pulse waveform in the first embodiment. FIG. 7(c) is a schematic diagram of a scan pulse waveform in a reference example. The sub-pixel circuits connected to the scan signal line Ga are fewer than the sub-pixel circuits connected to the scan signal line Gm; hence, for the gate drivers GD1 and GD2, the drive load of the scan signal line Ga, electrically connected to the gate drivers GD1 and GD2, is smaller than the drive load of the scan signal line Gm. Accordingly, adding a greater capacitance to the routed wire w1, connected to the scan signal line Ga, than the routed wire w4 can reduce the difference between the drive load of the scan signal line Gm and the drive load of the scan signal line Ga.

This reduction enables a scan pulse in the scan signal line Gm to have rise and fall waveforms, shown in FIG. 7(a), that are coincident with the rise and fall waveforms, shown in FIG. 7(b), of a scan pulse in each of the scan signal lines Ga. Consequently, brightness unevenness in the minor axis (the y-direction) is less likely to occur in the display region DA.

No capacitance addition to the routed wire w1 (i.e., in the absence of the conductive films K1 and K3) causes a signal pulse in the scan signal line Ga to have rise and fall waveforms, shown in FIG. 7(c), that are more abrupt than the rise and fall waveforms of a signal pulse in the scan signal line Gm, shown in FIG. 7(a). This can cause brightness unevenness.

Figure 8:
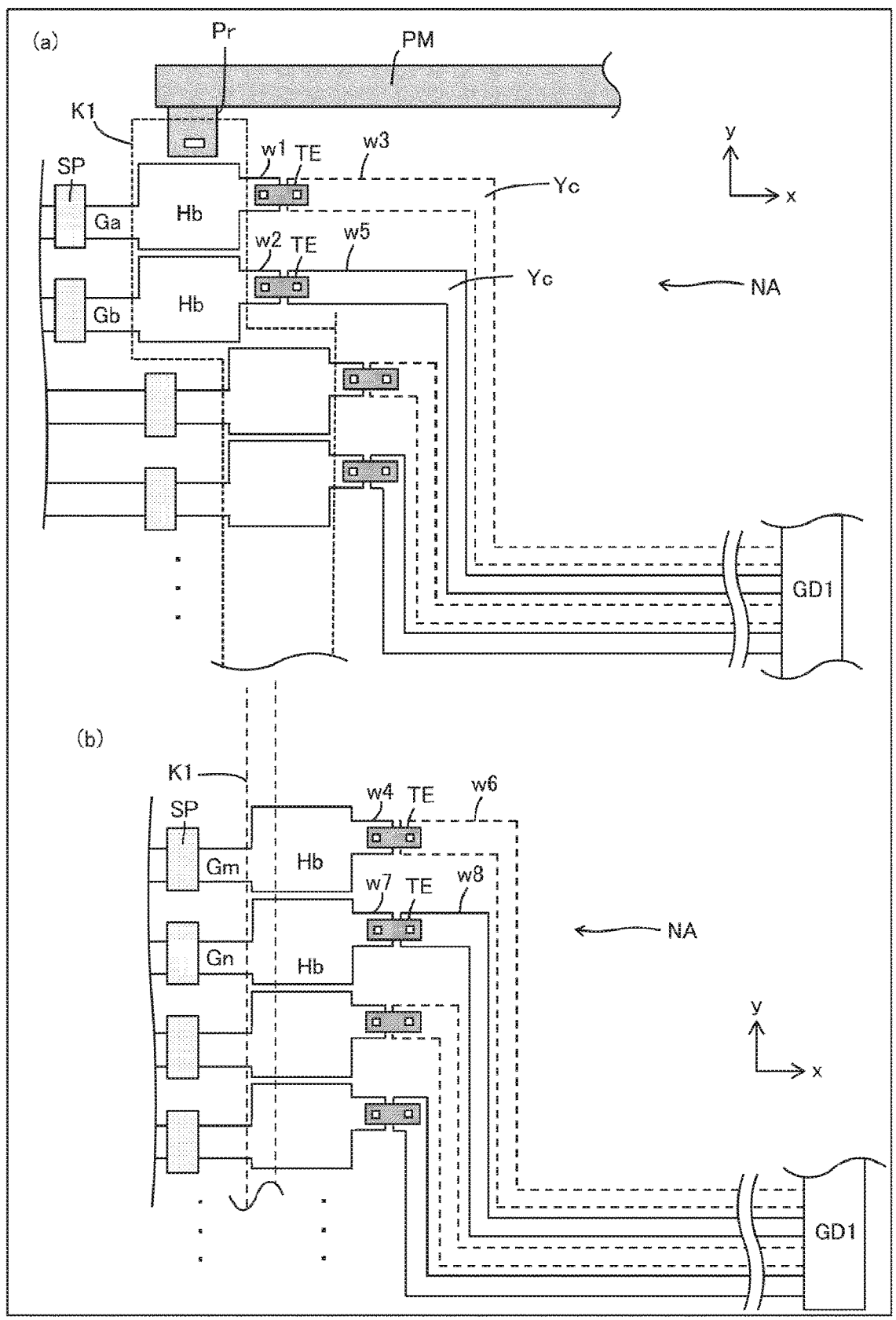
FIG. 8(a) is a plan view of a configuration around the edge of the display region in modification.
FIG. 8(b) is a plan view of another configuration around the edge of the display region.

As illustrated in FIG. 8, each of the routed wires w3 and w5 may have a bend Yc in a gap between the curved edge EC and the gate driver GD1, and the conductive film K1 may be disposed between the bend Yc and the curved edge EC in plan view. The conductive film K1 in FIGS. 5 and 6 is connected, via a contact hole, to a low-voltage power-source line Pr branched from a low-voltage power-source stem wire PM (included in the third metal layer), and the conductive film K1 receives a low-voltage power source (ELVSS). The low-voltage power source (ELVSS) is supplied to the cathode 25 of the light-emitting element ES. Further, the conductive film K1 overlaps the cathode 25 (a cathode common to the sub-pixel circuits).

In some embodiments, the conductive film K1 may be electrically connected to a high-voltage power-source stem wire, thus receiving a high-voltage power source (ELVDD). The high-voltage power source (ELVDD) is supplied to the capacitor Cp of the sub-pixel circuit shown in FIG. 4.

Figure 9:
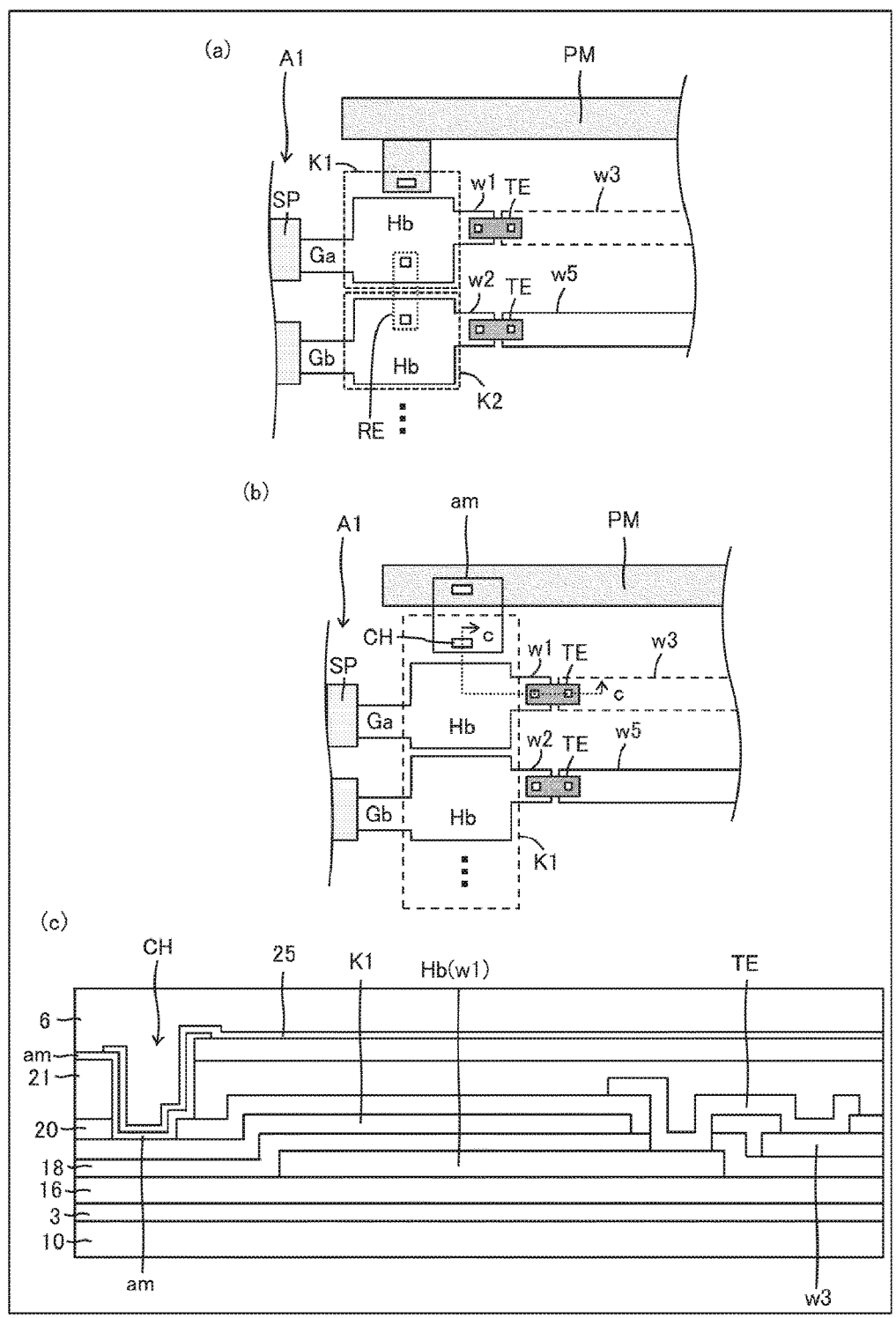
FIG. 9(a) and FIG. 9(b) are plan views of a frame region in modifications.
FIG. 9(c) is a cross-sectional view taken along line c-c in FIG. 9(b).

FIG. 9(a) and FIG. 9(b) are plan views of the configuration around the edge of the display region in modifications. FIG. 9(c) is a cross-sectional view taken along line c-c in FIG. 9(b). As illustrated in FIG. 9(a), the display device 2 may include the conductive film K1 in the form of an island overlapping the routed wire w1, and a conductive film K2 in the form of an island overlapping the routed wire w2. The display device 2 may be configured such that the conductive films K1 and K2 are electrically connected together via a wire RE (disposed in the same layer as the source wire SH in FIG. 2) included in the third metal layer. In this case, the conductive films K1 and K2 (included in the second metal layer) may be electrically connected together via a wire in the same layer as the second metal layer, a wire in the same layer as the anode 22, or a wire in the same layer as the cathode 25. The conductive films K1 and K2 in FIG. 9(a) cover in whole the respective wide portions Hb, thus providing a capacitance value that is less likely to vary even in occurrence of pattern discrepancy between the first and second metal layers.

As illustrated in FIG. 9(b) and FIG. 9(c), the display device 2 may have a contact hole CH, and a metal film am disposed in the same layer as the anode 22. The display device 2 may be configured such that the metal film am covers the upper surface of the conductive film K1 within the contact hole CH, and is in contact with the cathode 25 within the contact hole CH, thus supplying a low-voltage power-source (ELVSS) to the conductive film KL. The metal film am is electrically connected to the low-voltage power-source stem wire PM. The contact hole CH (trench) extends through the flattening film 21 and the edge cover 23, and is covered with the metal film am in its inside (i.e., the bottom surface and the side wall), thereby stopping water penetration into the display region DA.

Figure 10:
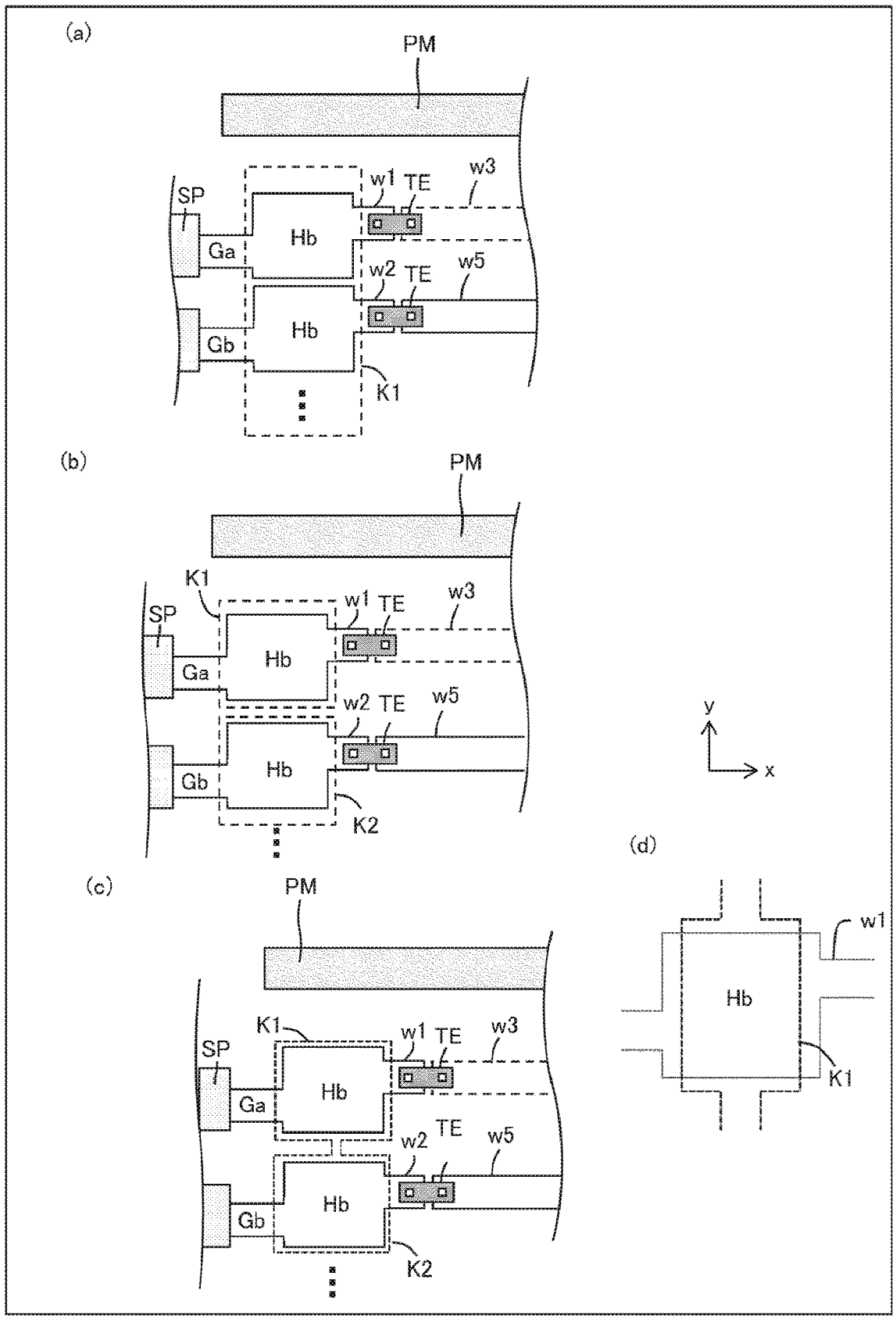
FIG. 10 is a plan view of further another configuration around the edge of the display region.

FIG. 10 is a plan view of the configuration around the edge of the display region in a further modification. The conductive film K1 may be electrically floating, as illustrated in FIG. 10(a). The display device 2 may include the conductive film K1 in the form of an island overlapping the routed wire w1, and the conductive film K2 in the form of an island overlapping the routed wire w2. The display device 2 may be configured such that the conductive films K1 and K2 are electrically floating. In this case, the conductive films K1 and K2 may be isolated (electrically separated) from each other, as illustrated in FIG. 10(b); alternatively, the conductive films K1 and K2 (included in the second metal layer) can be connected together (electrically connected together) via a wire included in the second metal layer. Alternatively, the conductive films K1 and K2 may be electrically connected together via a wire in the same layer as the third metal layer (e.g., the source wire SH), a wire in the same layer as the anode 22, or a wire in the same layer as the cathode 25. The conductive films K1 and K2 in FIG. 10(c) cover in whole the respective wide portions Hb, thus providing a capacitance value that is less likely to vary even in occurrence of pattern discrepancy. FIG. 10(d) illustrates a configuration where the conductive film K1 has two longitudinal sides (parallel to the y-direction) located between the two longitudinal sides of the wide portion Hb, and where the wide portion Hb has two lateral sides (parallel to the x-direction) located between the two lateral sides of the conductive film K1. This configuration can address pattern discrepancy between the first and second metal layers.

Second Embodiment

Figure 11:
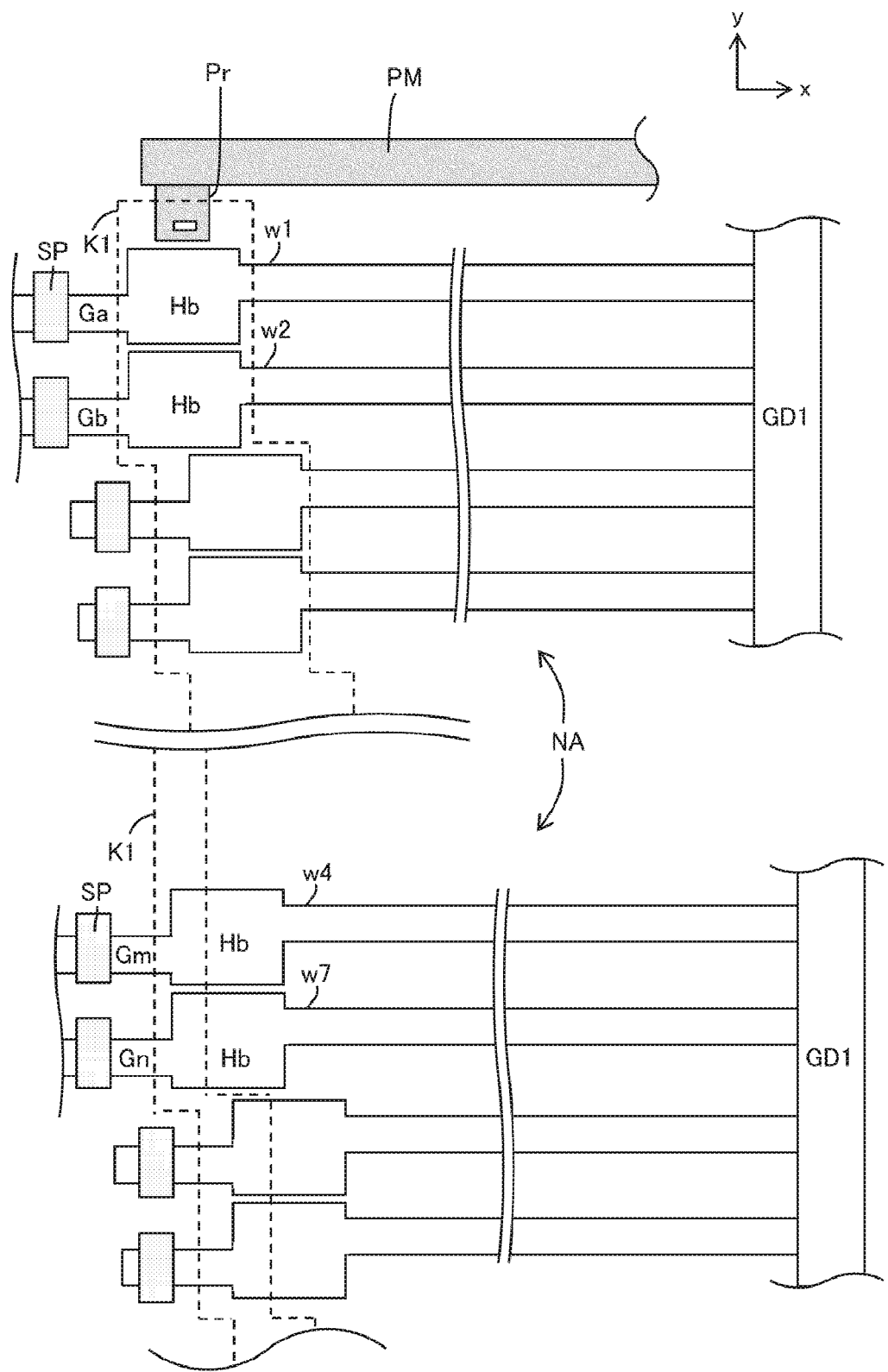
FIG. 11 is a plan view of the configuration of the display device according to a second embodiment.

FIG. 11 is a plan view of the configuration of the display device according to a second embodiment. The display device according to the first embodiment includes the routed wires w3 and w7 by way of example only. The routed wires w1 and w2 (first metal layer) may be routed to the gate driver GD1 and connected to the gate driver GD1, as illustrated in FIG. 11.

Third Embodiment

Figure 12:
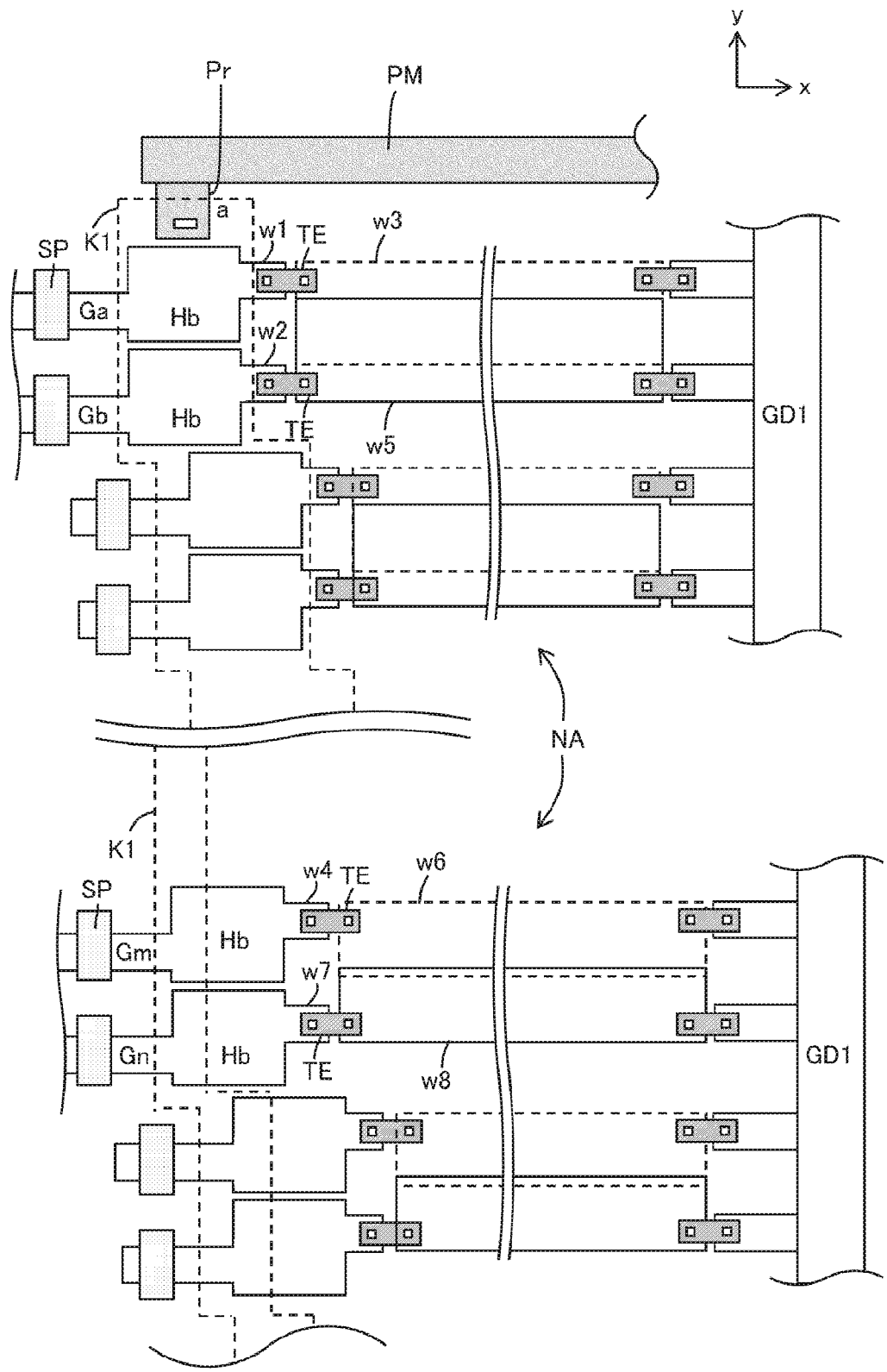
FIG. 12 is a plan view of the configuration of the display device according to a third embodiment.

FIG. 12 is a plan view of the configuration of the display device according to a third embodiment. The display device 2 in FIG. 12 includes the routed wire w3 (included in the second metal layer) electrically connected to the routed wire w1, and the routed wire w5 (included in the first metal layer) electrically connected to the routed wire w2. The routed wires w3 and w5 overlap each other via the inorganic insulating film 18. The overlap between the routed wires w3 and w5 has an elongated shape extending in the x-direction. This shape enables a capacitance to be mutually added to the routed wires w3 and w5, further preventing brightness unevenness in the minor axis (the y-direction) in the display region DA.

The display device 2 in FIG. 12 includes a routed wire w7 (included in the first metal layer) extending from a scan signal line Gn adjacent to the scan signal line Gm, and a routed wire w8 (included in the first metal layer) electrically connected to the routed wire w7 via a relay electrode TE and routed to the gate driver GD1. The overlap between the routed wires w6 and w8 is smaller in area than the overlap between the routed wires w3 and w5. That is, a capacitance that is added to the routed wire w6 (i.e., the capacitance between the routed wires W6 and w8) is smaller than a capacitance that is added to the routed wire w3 (i.e., the capacitance between the routed wires w3 and w5. Such a configuration further reduces the difference in drive load between the scan signal lines Ga and Gm.

Fourth Embodiment

Figure 13:
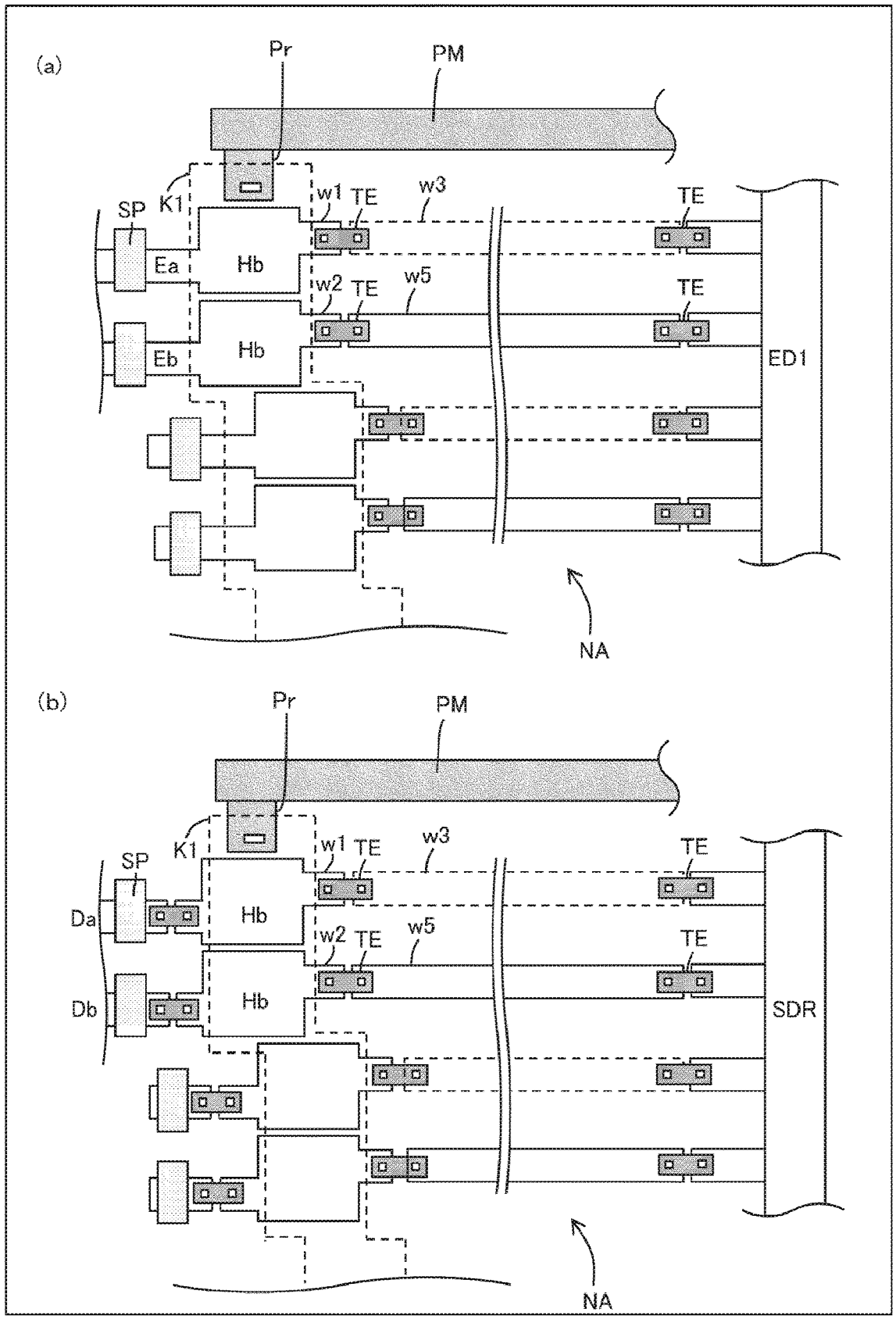
FIG. 13 is a plan view of the configuration of the display device according to a fourth embodiment.

FIG. 13 is a plan view of the configuration of the display device according to a fourth embodiment. As illustrated in FIG. 13(a), the routed wires w1 and w2 may be electrically connected to light-emission control lines Ea and Eb and the emission driver ED1. Alternatively, the routed wires w1 and w2 may be electrically connected to data signal lines Da and Db (included in the third metal layer) and the source driver SDR (e.g., a time-division drive circuit SSD monolithic in the frame region NA), as illustrated in FIG. 13(b).

Figure 14:
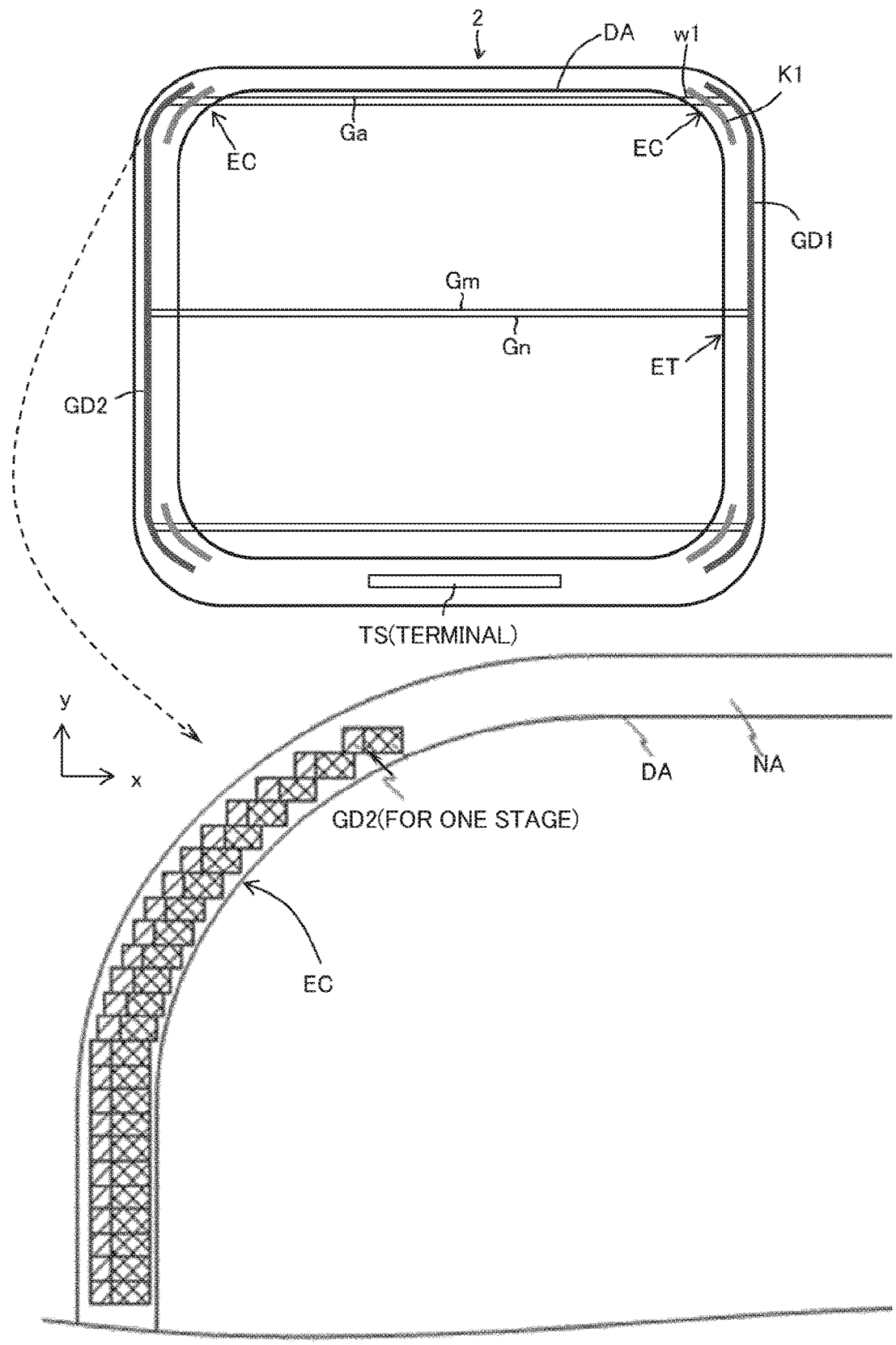
FIG. 14 is a plan view of an example shape of the display region.

Although having an elliptic shape in the foregoing embodiments, the display region DA may have any shape. The foregoing embodiments are applicable to a display region that is not rectangular (i.e., a shape that is not a quadrangle with four 90° angles, also referred to as a peculiar shape). For instance, the display region DA may have a shape with four linear edges ET and four round corners, as illustrated in FIG. 14. In this case, the edge of each round corner serves as the curved edge EC.

SUMMARY

The display device according to each of the foregoing embodiments may include any electro-optical element (an electro-optical element whose brightness and transmittance are regulated by current). Examples of the display device according to each embodiment include the following: an organic electro-luminescence (EL) display having organic light-emitting diodes (OLEDs), which are electro-optical elements; an inorganic EL display having inorganic light-emitting diodes, which are electro-optical elements; and a QLED display having quantum-dot light-emitting diodes (QLEDs), which are electro-optical elements.

First Aspect

A display device includes a display region that is non-rectangular, and a frame region disposed around the display region. The display region includes the following: a plurality of data signal lines that transmit a data signal, a plurality of scan signal lines intersecting with the plurality of data signal lines; a plurality of light-emission control lines; and a plurality of sub-pixel circuits provided so as to correspond to points of intersection between the plurality of data signal lines and the plurality of scan signal lines. The display device includes the following: a drive circuit electrically connected to the plurality of data signal lines; a drive circuit electrically connected to the plurality of scan signal lines; and a drive circuit electrically connected to the plurality of light-emission control lines. The frame region includes a first routed wire extending from one of the plurality of scan signal lines, one of the plurality of light-emission control lines, or one of the plurality of data signal lines. The first routed wire is electrically connected to the drive circuits. The first routed wire is included in a first metal layer. The display device includes a first conductive film included in a second metal layer. The first routed wire and the first conductive film overlap each other via an inorganic insulating film.

Second Aspect

The display device according, for instance, to the first aspect is configured such that the first routed wire has a wide portion widening the first routed wire locally. The display device is also configured such that the first conductive film overlaps the wide portion.

Third Aspect

The display device according, for instance, to the second aspect is configured such that the first conductive film overlaps the wide portion in whole.

Fourth Aspect

The display device according, for instance, to the second or third aspect is configured such that the wide portion has an elongated shape having a larger size in the direction where the first routed wire extends than in the direction of widening.

Fifth Aspect

The display device according, for instance, to any one of the first to fourth aspects is configured such that the first routed wire is electrically connected to one of the plurality of scan signal lines included in the first metal layer, and such that the drive circuit transmits a signal to one of the plurality of scan signal lines.

Sixth Aspect

The display device according, for instance, to any one of the first to fifth aspects is configured such that the drive circuits are disposed in the frame region so as to be along the edge of the display region, and such that the drive circuits transmit a signal to one of the plurality of scan signal lines, one of the plurality of light-emission control lines, or one of the plurality of data signal lines via the first routed wire. The display device is also configured such that the non-rectangular display region has at least one corner whose edge is curved or inclined, and such that the first routed wire and the first conductive film are disposed between the drive circuits and the at least one corner.

Seventh Aspect

The display device according, for instance, to any one of the first to fifth aspects is configured such that the drive circuits are disposed along the curved edge of the display region, and such that the drive circuits transmit a signal to one of the plurality of scan signal lines, one of the plurality of light-emission control lines, or one of the plurality of data signal lines via the first routed wire. The display device is also configured such that the first routed wire and the first conductive film are disposed between the drive circuits and the curved edge.

Eighth Aspect

The display device according, for instance, to any one of the first to fifth aspects is configured such that each of the drive circuits is disposed in the frame region so as to be along the non-rectangular display region.

Ninth Aspect

The display device according, for instance, to any one of the first to eighth aspects is configured such that the first conductive film has an arcuate shape whose width increases from the middle toward both ends of the first conductive film in plan view.

Tenth Aspect

The display device according, for instance, to any one of the first to ninth aspects is configured such that the first conductive film is a fixed-potential wire.

Eleventh Aspect

The display device according, for instance, to any one of the first to ninth aspects is configured such that the first conductive film is electrically floating.

Twelfth Aspect

The display device according, for instance, to any one of the first to tenth aspects is configured such that the first conductive film is electrically connected to a wire that supplies a power-source voltage to the plurality of sub-pixel circuits, or is electrically connected to an anode or cathode of a light-emitting element included in each of the plurality of sub-pixel circuits.

Thirteenth Aspect

The display device according, for instance, to any one of the first to twelfth aspects is configured such that each of the plurality of sub-pixel circuits includes a capacitor electrode, and such that the capacitor electrode is included in the second metal layer.

Fourteenth Aspect

The display device according, for instance, to any one of the first to thirteenth aspects is configured such that the first conductive film extends across the first routed wire.

Fifteenth Aspect

The display device according, for instance, to any one of the first to thirteenth aspects includes a second routed wire adjacent to the first routed wire and included in the first metal layer. The display device is configured such that the second routed wire and the first conductive film overlap each other via the inorganic insulating film.

Sixteenth Aspect

The display device according, for instance, to the eleventh aspect includes a second routed wire adjacent to the first routed wire and included in the first metal layer, and a second conductive film included in the second metal layer. The display device is configured such that the second routed wire and the second conductive film overlap each other via the inorganic insulating film. The display device is also configured such that the second conductive film is electrically floating and electrically isolated from the first conductive film adjacent to the second conductive film.

Seventeenth Aspect

The display device according, for instance, to the eleventh aspect includes a second routed wire adjacent to the first routed wire and included in the first metal layer, and a second conductive film included in the second metal layer. The display device is configured such that the second routed wire and the second conductive film overlap each other via the inorganic insulating film, such that the second conductive film is electrically connected to the first conductive film adjacent to the second conductive film, and such that the electrically connected first and second conductive films are electrically floating.

Eighteenth Aspect

The display device according, for instance, to any one of the first to seventeenth aspects includes the following: a stack of, in sequence, the first metal layer, the inorganic insulating film, the second metal layer, a different inorganic insulating film, and a third metal layer, a second routed wire adjacent to the first routed wire and included in the first metal layer; and a second conductive film adjacent to the first conductive film and included in the second metal layer. The display device is configured such that the second routed wire and the second conductive film overlap each other via the inorganic insulating film, and such that the first and second conductive films are electrically connected together via the third metal layer. The first and second conductive films each have an island-shape.

Nineteenth Aspect

The display device according, for instance, to the eighteenth aspect is configured such that the third metal layer is a layer that includes an anode or cathode of a light-emitting element included in each of the plurality of sub-pixel circuits, or includes the plurality of data signal lines.

Twentieth Aspect

The display device according, for instance, to the eighteenth aspect is configured such that in plan view, the first and second conductive films overlap an upper-layer electrode of a light-emitting element that is driven in each of the plurality of sub-pixel circuits.

Twenty-First Aspect

The display device according, for instance, to any one of the first to twentieth aspects is configured such that in a gap between the display region and the drive circuits, the first routed wire and the first conductive film overlap each other via the inorganic insulating film.

Twenty-Second Aspect

The display device according, for instance, to any one of the first to twenty-first aspects is configured such that the frame region includes a third routed wire electrically connected to the first routed wire, and such that the first routed wire and the drive circuits are electrically connected together via the third routed wire.

Twenty-Third Aspect

The display device according, for instance, to the twenty-second aspect is configured such that the third routed wire has a bend, and such that the first conductive film is disposed between the bend and the display region in plan view.

Twenty-Fourth Aspect

The display device according, for instance, to the twenty-second or twenty-third aspect is configured such that the third routed wire is included in the first or second metal layer.

Twenty-Fifth Aspect

The display device according, for instance, to the sixth or seventh aspect includes a fourth routed wire closer to the middle of the display region than the first routed wire is. The fourth routed wire overlaps the first conductive film via the inorganic insulating film. The display device is configured such that the overlap between the first routed wire and the first conductive film is larger in area than the overlap between the fourth routed wire and the first conductive film.

Twenty-Sixth Aspect

The display device according, for instance, to the twenty-fifth aspect is configured such that the plurality of sub-pixel circuits electrically connected to the fourth routed wire outnumbers the plurality of sub-pixel circuits electrically connected to the first routed wire.

Twenty-Seventh Aspect

The display device according, for instance, to the twenty-second aspect includes a second routed wire adjacent to the first routed wire and included in the first metal layer, and a fifth routed wire routed to the frame region. The display device is configured such that the second routed wire and the drive circuits are electrically connected together via the fifth routed wire, and such that the third and fifth routed wires overlap each other via the inorganic insulating film.

Twenty-Eighth Aspect

The display device according, for instance, to the twenty-seventh aspect includes fourth and seventh routed wires closer to the middle of the display region than the first routed wire is. The fourth and seventh routed wires overlap the first conductive film via the inorganic insulating film. The display device is configured such that the fourth routed wire and the drive circuits are electrically connected together via a sixth routed wire, such that the seventh routed wire and the drive circuits are electrically connected together via an eighth routed wire, and such that the sixth and eighth routed wires overlap each other via the inorganic insulating film.

Twenty-Ninth Aspect

The display device according, for instance, to the twenty-eighth aspect is configured such that the overlap between the third and fifth routed wires is larger in area than the overlap between the sixth and eighth routed wires.

Thirtieth Aspect

The display device according, for instance, to the twenty-ninth aspect is configured such that the plurality of sub-pixel circuits electrically connected to the sixth routed wire outnumbers the plurality of sub-pixel circuits electrically connected to the third routed wire.

Thirty-First Aspect

The display device according, for instance, to any one of the first to thirtieth aspects is configured such that the display region has an elliptic shape, and such that the plurality of scan signal lines and the plurality of light-emission control lines extend in a direction parallel to the major axis of the elliptic shape.

The invention claimed is:
1. A display device comprising:
   a display region that is non-rectangular; and
   a frame region disposed around the display region,
   the display region including
      a plurality of data signal lines configured to transmit a data signal,
      a plurality of scan signal lines intersecting with the plurality of data signal lines,
      a plurality of light-emission control lines, and
      a plurality of sub-pixel circuits provided so as to correspond to points of intersection between the plurality of data signal lines and the plurality of scan signal lines,
   the display device comprising
      a drive circuit electrically connected to any one of the plurality of data signal lines, the plurality of scan signal lines and the plurality of light-emission control lines,
   the frame region including
      a first routed wire extending from one of the plurality of scan signal lines, one of the plurality of light-emission control lines, or one of the plurality of data signal lines, the first routed wire being electrically connected to the drive circuit, the first routed wire being included in a first metal layer,
   the display device comprising
      a first conductive film included in a second metal layer,
   the first routed wire and the first conductive film overlapping each other via an inorganic insulating film,
   wherein the first routed wire has a wide portion widening the first routed wire locally, and
   the first conductive film overlaps the wide portion.

2. The display device according to claim 1, wherein the first conductive film overlaps the wide portion in whole.

3. The display device according to claim 1, wherein the wide portion has an elongated shape having a larger size in a direction where the first routed wire extends than in a direction of widening.

4. The display device according to claim 1, wherein
   the first routed wire is electrically connected to one of the plurality of scan signal lines included in the first metal layer, and
   the drive circuit transmits a signal to one of the plurality of scan signal lines.

5. The display device according to claim 1, wherein
   the drive circuit is disposed in the frame region so as to be along an edge of the display region,
   the drive circuit transmits a signal to one of the plurality of scan signal lines, one of the plurality of light-emission control lines, or one of the plurality of data signal lines via the first routed wire,
   the non-rectangular display region comprises at least one corner whose edge is curved or inclined, and
   the first routed wire and the first conductive film are disposed between the drive circuit and the at least one corner.

6. The display device according to claim 1, wherein
   the drive circuit is disposed along a curved edge of the display region,
   the drive circuit transmits a signal to one of the plurality of scan signal lines, one of the plurality of light-emission control lines, or one of the plurality of data signal lines via the first routed wire, and the first routed wire and the first conductive film are disposed between the drive circuit and the curved edge.

7. The display device according to claim 1, wherein the drive circuit is disposed in the frame region so as to be along the non-rectangular display region.

8. The display device according to claim 1, wherein the first conductive film has an arcuate shape whose width increases from a middle toward both ends of the first conductive film in a plan view.

9. The display device according to claim 1, wherein the first conductive film is electrically floating.

10. The display device according to claim 9, comprising:
a second routed wire adjacent to the first routed wire and included in the first metal layer; and
a second conductive film included in the second metal layer,
wherein the second routed wire and the second conductive film overlap each other via the inorganic insulating film, and
the second conductive film is electrically floating and electrically isolated from the first conductive film adjacent to the second conductive film.

11. The display device according to claim 9, comprising:
a second routed wire adjacent to the first routed wire and included in the first metal layer; and
a second conductive film included in the second metal layer,
wherein the second routed wire and the second conductive film overlap each other via the inorganic insulating film,
the second conductive film is electrically connected to the first conductive film adjacent to the second conductive film, and
the electrically connected first and second conductive films are electrically floating.

12. The display device according to claim 1, comprising:
a stack of, in sequence, the first metal layer, the inorganic insulating film, the second metal layer, a different inorganic insulating film, and a third metal layer;
a second routed wire adjacent to the first routed wire and included in the first metal layer; and
a second conductive film adjacent to the first conductive film and included in the second metal layer,
wherein the second routed wire and the second conductive film overlap each other via the inorganic insulating film, and
the first and second conductive films are electrically connected together via the third metal layer, the first and second conductive films each having an island-shape.

13. The display device according to claim 12, wherein the third metal layer is a layer that includes an anode or cathode of a light-emitting element included in each of the plurality of sub-pixel circuits, or includes the plurality of data signal lines.

14. The display device according to claim 12, wherein in a plan view, the first and second conductive films overlap an upper-layer electrode of a light-emitting element configured to be driven in each of the plurality of sub-pixel circuits.

15. The display device according to claim 1, wherein
the frame region includes a third routed wire electrically connected to the first routed wire, and
the first routed wire and the drive circuit are electrically connected together via the third routed wire.

16. The display device according to claim 5, comprising
a fourth routed wire closer to a middle of the display region than the first routed wire is, the fourth routed wire overlapping the first conductive film via the inorganic insulating film,
wherein an overlap between the first routed wire and the first conductive film is larger in area than an overlap between the fourth routed wire and the first conductive film.

17. The display device according to claim 16, wherein the plurality of sub-pixel circuits electrically connected to the fourth routed wire outnumbers the plurality of sub-pixel circuits electrically connected to the first routed wire.

18. The display device according to claim 15, comprising:
a second routed wire adjacent to the first routed wire and included in the first metal layer; and
a fifth routed wire routed to the frame region,
wherein the second routed wire and the drive circuit are electrically connected together via the fifth routed wire, and
the third and fifth routed wires overlap each other via the inorganic insulating film,
the display device comprising
fourth and seventh routed wires closer to a middle of the display region than the first routed wire is, the fourth and seventh routed wires overlapping the first conductive film via the inorganic insulating film,
wherein the fourth routed wire and the drive circuit are electrically connected together via a sixth routed wire,
the seventh routed wire and the drive circuit are electrically connected together via an eighth routed wire, and
the sixth and eighth routed wires overlap each other via the inorganic insulating film,
wherein an overlap between the third and fifth routed wires is larger in area than an overlap between the sixth and eighth routed wires.

19. The display device according to claim 18, wherein the plurality of sub-pixel circuits electrically connected to the sixth routed wire outnumbers the plurality of sub-pixel circuits electrically connected to the third routed wire.

* * * * *